(12) United States Patent
Tong et al.

(10) Patent No.: US 6,665,833 B1
(45) Date of Patent: Dec. 16, 2003

(54) PUNCTURING OF CONVOLUTIONAL CODES

(75) Inventors: Wen Tong, Ottawa (CA); Stephan Gosne, Issy les Moulineaux (FR); Catherine Leretaille (formerly Gauthier), Paris (FR); Frederic Gabin, Bagnolet (FR)

(73) Assignee: Nortel Networks Limited, St. Laurent (CA)

( * ) Notice: Subject to any disclaimer, the term of this patent is extended or adjusted under 35 U.S.C. 154(b) by 415 days.

(21) Appl. No.: 09/597,740

(22) Filed: Jun. 19, 2000

(30) Foreign Application Priority Data

Jul. 8, 1999 (CA) ............................................. 2277239

(51) Int. Cl.$^7$ ........................................... H03M 13/03
(52) U.S. Cl. ....................................... 714/790; 714/795
(58) Field of Search ................................ 714/790, 786, 714/792

(56) References Cited

U.S. PATENT DOCUMENTS

| | | | |
|---|---|---|---|
| 6,298,461 B1 * | 10/2001 | Tong et al. .................. | 714/755 |
| 6,347,385 B1 * | 2/2002 | Cui et al. ................... | 714/701 |
| 6,400,703 B1 * | 6/2002 | Park et al. .................. | 370/342 |
| 6,427,214 B1 * | 7/2002 | Li et al. ..................... | 714/701 |
| 6,460,159 B1 * | 10/2002 | Kim et al. ................... | 714/790 |

OTHER PUBLICATIONS

Stephen B. Wicker, "Error Control Systems for Digital Communication and Storage", 1995, pp. 284–285, 323–329.*

Joachim Hagenauer, "Rate–Compatible Punctured Convolutional codes and their Applications", Apr. 1988, IEEE Trans. on Communications, Vol 36, No4, pp. 389–400.*

Pal Frenger et al. "zRate–Compatible Convolutional Codes for Multirate DS–CDMA Systems", Jun. 1999, IEEE Trans. on Comm, Vol 47, No 6, pp. 828–836.*

Omer Acikel et al., "High Rate Turbo Codes for BPSK/QPSK Channels", Sep. 1998, IEEE Trans on Comm, pp. 422–427.*

Mats Oberg et al., "The Effect of puncturing in Turbo Encoders", 1997 NEC Research Index.*

Mark Ho et al., "Interleavers For Punctured Turbo Codes", 1998, NEC Research Index.*

Fan Mo, "Analysis of Puncturing Pattern for High Rate Turbo Codes", IEEE Trans on Comm, 5/99, pp. 547–550.*

"Puncturing Algorithm for Turbo Code", Apr. 1999, 3GPP Workgroup #4, 3GPP/TSG/RAN/WG#4 TDOC 338/99, p. 1–6.*

J Cain, "Punctured Convoultional Codes of Rate (n–1)/n and Simplied", 1979, IEEE Trans on Inform. Thoery, Vol IT–25, p. 97–100.*

Min–Goo Kim, "On Systematic Punctured Convolutional Codes", Feb. 1997, IEEE Trans. on Communications, Vol 45, No 2, pp. 133–139.*

Douglas N. Rowitch, "On The performance ofHybrid FEC/ARQ Systems Using Rate Compatible Punctured Turbo (RCPT) Codes", IEEE Transactions on Comm.,.*

* cited by examiner

Primary Examiner—Albert Decady
Assistant Examiner—William Moore
(74) Attorney, Agent, or Firm—Gibbons, Del Deo, Dolan, Griffinger & Vecchione, P.C.

(57) ABSTRACT

In a turbo coder, rate conversion and/or rate matching is achieved by deleting parity bits P1 and P2 from the outputs of two constituent coders, one supplied with data bits to be coded and the other supplied with the same data bits after interleaving. Deleted bits are determined by a rate matching control unit directly for the P1 bits and via a similar position interleaving step for the P2 bits. A similar rate matching arrangement is provided for only two of the three outputs of a rate ⅓ convolutional coder, the third output corresponding to a strongest coding polynomial in terms of minimum free distance and none of its coded data bits being deleted.

18 Claims, 2 Drawing Sheets

PUNCTURING OF CONVOLUTIONAL CODES

This invention relates to puncturing (deletion of bits of coded data) of convolutional codes, in particular parallel concatenated convolutional codes (PCCCs) or so-called turbo codes, for code rate conversion or rate matching.

BACKGROUND OF THE INVENTION

It is well known, especially in communications systems but also in other applications such as information storage systems, to use various forms of convolutional coding in order to reduce the susceptibility of the information to errors. Such coding introduces redundancy to the information to be communicated or stored, and this redundancy is made use of on reception or retrieval of the information to detect and correct errors. The errors can be distributed, in order to facilitate their detection and correction, by an interleaver.

An increasingly significant type of convolutional coder is a turbo coder, in which data bits to be encoded are supplied directly to the input of a first recursive systematic convolutional coder (RSCC) and via an interleaver to the input of a second, typically similar, RSCC. The outputs of the RSCCs comprise systematic bits, i.e. the supplied data bits themselves, and parity bits. Typically to provide a desired rate of coding, all of the systematic bits and selected ones of the parity bits are forwarded for communication or storage, in what is referred to as a fixed puncturing process for rate conversion. In essence, this process deletes, or punctures, in accordance with a fixed pattern, some of the parity bits so that the forwarded bit rate is matched to a desired value. For example, this may be done to provide rate ½ coding from a rate ⅓ coder.

It can also be desirable to provide flexible or variable puncturing for rate matching. For example, a coder in a communications channel may be required to receive a variable input data rate and to provide coded data at a fixed rate. In one communications system under consideration, it is proposed that variable puncturing rates be applicable to up to 20% of the coded block size to provide rate matching. Thus in such an arrangement different numbers of coded bits may be punctured, and it has been proposed that this variable puncturing be applied to all of the output bits of a turbo coder, or alternatively to only the parity bits (in addition to any fixed puncturing).

In addition to turbo coding, non-systematic convolutional coding may be applied to data bits, the resulting coded bits produced by the coder not including the original data (systematic) bits. For example, a convolutional coder may be a rate ⅓ coder providing three coded output bits for each input bit. Again in this case it may be desired to provide variable puncturing for rate matching, for example with puncturing to up to 20% of the coded block size, and it has been proposed that this be done by applying the puncturing to the coder output in a manner such that the punctured or deleted coded bits are distributed as much as possible throughout the coded data blocks.

In each of these situations, it is desirable for the bits that are punctured or deleted to be selected so that the puncturing or rate matching processes have the least possible adverse effect on the ultimate recovery of the data being communicated. However, such optimization of the puncturing or rate matching processes presents a significant problem.

Accordingly, an object of this invention is to facilitate improved puncturing or rate matching for convolutionally coded, and especially turbo coded, data.

SUMMARY OF THE INVENTION

One aspect of this invention provides a method of deleting parity bits produced by first and second convolutional coders of a coder arrangement to provide a desired rate of coded bits, data bits to be coded being supplied to the first coder and being supplied after an interleaving process to the second coder, comprising the steps of: deleting parity bits from an output of the first coder; determining positions of parity bits that are not deleted from the output of the first coder; interleaving the determined positions in accordance with said interleaving process; and deleting parity bits from an output of the second coder at positions corresponding to the determined interleaved positions.

For example, the method may be used for rate conversion from a rate ⅓ to a rate ½ coder, to which rate matching may also be applied, so that approximately half of the parity bits are deleted from the output of each of the first and second coders.

Another aspect of the invention provides a coder arrangement comprising: a first convolutional coder responsive to data bits to be coded for producing first parity bits; an interleaver arranged to interleave in a predetermined manner the data bits to be coded to produce interleaved data bits; a second convolutional coder responsive to the interleaved data bits for producing second parity bits; means for providing the data bits to be coded and some of the first and second parity bits as coded output data of the coder arrangement, others of the first and second parity bits being deleted; a control unit for determining which of the first parity bits are deleted; and an interleaver responsive to the control unit for interleaving in said predetermined manner positions of the first parity bits that are not deleted to determine positions of the second parity bits which are deleted.

Typically alternate ones of the first parity bits are deleted.

Another aspect of the invention provides a method of rate matching by deleting coded data bits produced by a convolutional coder from data bits to be coded, the convolutional coder providing a plurality of outputs corresponding to respective coding polynomials, the polynomials providing respective coding strengths in terms of minimum free distance, the method comprising the steps of: deleting coded data bits from at least one of the coder outputs corresponding to a relatively weak polynomial; and providing all of the coded data bits from at least another one of the coder outputs corresponding to a relatively strong polynomial with undeleted coded bits of the other coder outputs to provide coded data bits at a desired rate.

In a presently preferred form of this method, the convolutional coder has three outputs and coded data bits are deleted from each of two of the outputs corresponding to the two weakest polynomials. In particular, the convolutional coder can have a constraint length K=9 and coding polynomials represented by octal numbers 557, 633, and 711, coded data bits being deleted from the outputs corresponding to the polynomials 557 and 633 and not being deleted from the output corresponding to the polynomial 711.

The invention also provides a method of convolutional coding and rate matching data to provide coded data in response to data to be coded, comprising the steps of: coding data to be coded in accordance with a rate ⅓ convolutional code of constraint length K=9 with polynomials represented by octal numbers 557, 633, and 711 to produce respective coded data bits; and supplying all of the coded data bits corresponding to the polynomial 711 and only some of the coded data bits corresponding to the polynomials 557 and 633 to provide said coded data at a desired rate less than three times the rate of the data to be coded.

A further aspect of the invention provides a coder arrangement comprising: a convolutional coder responsive to data bits to be coded to provide coded data bits at a plurality of outputs corresponding to respective coding polynomials, the polynomials providing respective coding strengths in terms of minimum free distance; and means for providing all of the coded data bits from at least one of the coder outputs corresponding to relatively strong polynomial, and only some of the coded data bits from each other coder output corresponding to a relatively weaker polynomial, as coded data bits at a desired rate.

The convolutional coder can conveniently have three outputs with said desired rate being less than three times a rate of the data bits to be coded. In a particular form of the coder arrangement, the convolutional coder has a constraint length K=9 and coding polynomials represented by octal numbers 557, 633, and 711, and the coded data bits at the desired rate include all of the coded data bits from the coder output corresponding to the polynomial 711.

The invention further provides a convolutional coding and rate matching arrangement comprising: a rate ⅓ convolutional coder of constraint length K=9 with polynomials represented by octal numbers 557, 633, and 711 for producing coded data bits at respective outputs in response to data bits to be coded supplied to an input of the convolutional coder; and means for providing all of the coded data bits from the convolutional coder output corresponding to the polynomial 711 and only some of the coded data bits from the convolutional coder outputs corresponding to the polynomials 557 and 633 to provide coded data at a desired rate less than three times the rate of the data to be coded.

BRIEF DESCRIPTION OF THE DRAWINGS

The invention will be further understood from the following description with reference to the accompanying drawings, in which.

DETAILED DESCRIPTION

Figure 1:
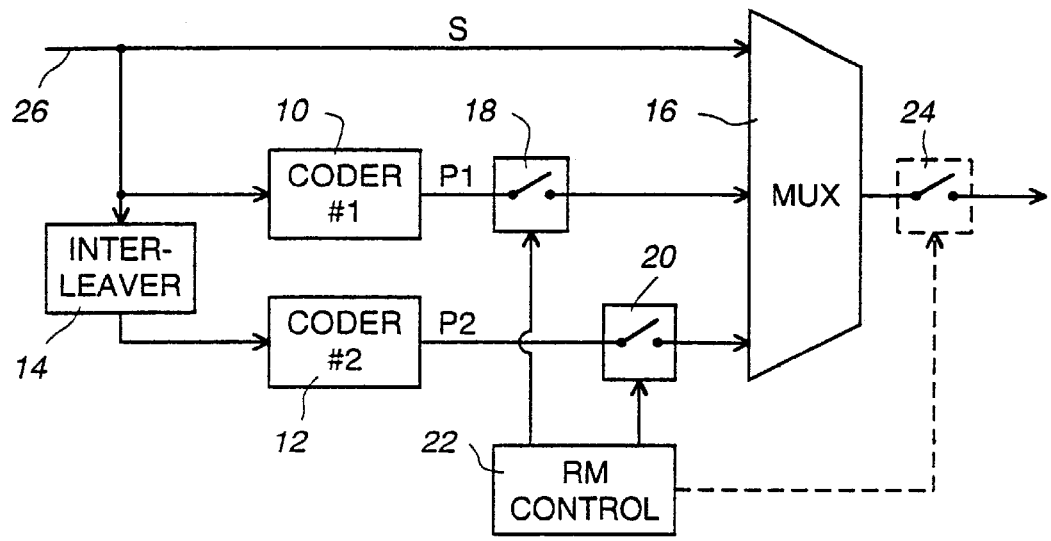
FIG. 1 schematically illustrates in a block diagram a known turbo coder and rate matching arrangement.

Referring to the drawings, FIG. 1 illustrates a known turbo coder, comprising constituent coders #1 and #2 which are substantially the same as one another and are referenced 10 and 12, an interleaver 14, and a multiplexer 16, with puncturing represented by switches 18 and 20 in output paths from the coders 10 and 12 respectively to the multiplexer 16. The switches 18 and 20 are controlled for fixed puncturing for rate conversion by a rate matching (RM) control unit 22. These switches 18 and 20, or a further switch 24 optionally provided in an output path of the multiplexer 16 as shown by dashed lines, may also be controlled by the RM control unit 22 for variable puncturing for rate matching.

As is well known, input data bits to be coded are supplied via an input 26 as systematic bits S to one input of the multiplexer 16, to an input of the coder 10, and via the interleaver 14 to an input of the coder 12. The coders are typically identical recursive systematic convolutional coders which produce, for each input bit, a parity bit P1 and P2 respectively at their outputs. In the absence of the switches 18, 20, and 24 and the RM control unit 22, the multiplexer 16 consequently produces 3 bits at its output for each input data bit, thus constituting a rate ⅓ coder. Rate conversion to a lower fixed coding rate is achieved by the RM control unit 22 controlling the switches 18 and 20 so that not all of the parity bits P1 and P2 are supplied to the multiplexer 16. In one well known and typical example, the switches 18 and 20 are alternately opened and closed so that only alternate parity bits P1 and P2 are supplied to the multiplexer 16, which consequently provides only two bits (one systematic bit and one parity bit) to its output for each input data bit, thereby constituting a rate ½ coder. Other fixed coding rates, and hence fixed rate conversion, can be similarly provided.

The typical example for a rate ½ coder described above can be represented by the following Table 1:

TABLE 1

| S  | s0 | s1 | s2 | s3 | s4 | s5 | s6 | s7 | s8 | s9 | s10 |
|----|----|----|----|----|----|----|----|----|----|----|-----|
| P1 | ~~p0~~ | p1 | ~~p2~~ | p3 | ~~p4~~ | p5 | ~~p6~~ | p7 | ~~p8~~ | p9 | ~~p10~~ |
| P2 | q0 | ~~q1~~ | q2 | ~~q3~~ | q4 | ~~q5~~ | q6 | ~~q7~~ | q8 | ~~q9~~ | q10 |

In Table 1, bits s0 to s10 represent consecutive systematic bits S, bits p0 to p10 represent corresponding parity bits P1, and bits q0 to q10 represent corresponding parity bits P2. Strike-through lines indicate bits that are punctured or deleted in the alternating pattern referred to above, this being accomplished (as represented schematically in FIG. 1) by opening the switches 18 and 20 at respective times.

For variable puncturing for rate matching, either the switch 24 is provided and is controlled to apply additional puncturing at the output of the multiplexer 16 under the control of the RM control unit 22, or this control unit controls the switches 18 and 20 to provide additional puncturing of only the parity bits to achieve the desired variable puncturing. For example, an input data bit stream may comprise 41 bits within a frame time for accommodating 120 bits at the output of the multiplexer 16, and the coder may be a rate ⅓ coder producing 123 output bits from the 41 input bits. Accordingly, 3 bits in the frame must be deleted, or punctured by the switches under the control of the unit 22. Similarly, an input data stream of 61 bits in a frame time with a rate ½ coder would require an additional 2 bits to be punctured to be accommodated in a 120-bit frame.

As discussed in the background, a proposed communications system specifies flexible or variable puncturing for rate matching by puncturing bits to up to 20% of the coded frame size, to accommodate various input data rates. It is observed that various input data rates may be present on different channels which may be interleaved by interleavers; these are not shown in FIG. 1 or elsewhere in the drawings of this application because they are not relevant to the operation of the invention itself, but it should be understood that they can be incorporated at desired positions within the arrangements described herein.

As also explained in the background, it is desirable for the puncturing of bits, whether for fixed rate conversion or for rate matching, to have as little adverse effect as possible on the error correction purposes of the coding arrangement. However, this is difficult in view of the extent of puncturing that may take place, the variable data rates that may need to be accommodated, and other factors such as the operation of the interleaver 14. Generally, it has been supposed in the art that an even distribution of punctured bits will optimize, i.e. minimize, the adverse effects of the puncturing process.

However, by way of a simple example, it can be appreciated that with the alternate puncturing of parity bits P1 and P2 as described above to provide a fixed rate ½ coder, a parity bit P1 corresponding to a given systematic bit S may be deleted and, at an earlier or later time due to the interleaving of systematic bits by the interleaver 14, a parity bit P2 corresponding to the same systematic bit may also be deleted. For example, in Table 1 above, the bit p2, corresponding to the systematic bit s2, is deleted. If the interleaving performed on the systematic bits by the interleaver 14 moves the bit s2 to the position of, for example, the bit s7 as shown in Table 1, then it can be seen that the parity bit P2 corresponding to the interleaved systematic bit s2 is q7, which is also deleted according to the alternating puncturing pattern. It is desirable to avoid this situation, which is here called parity loss puncturing, especially in view of the manner in which the parity bits are used for decoding at a receiver of the communications system.

Figure 2:
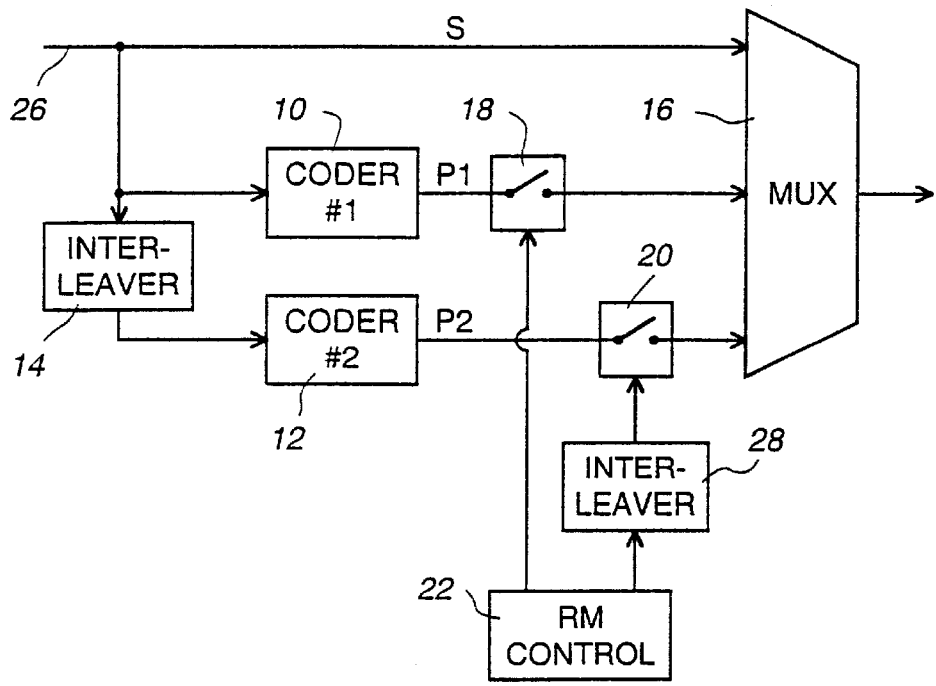
FIG. 2 schematically illustrates in a block diagram a turbo coder and rate matching arrangement in accordance with an embodiment of this invention, and FIG. 3 schematically illustrates in a block diagram a convolutional coder and rate matching arrangement in accordance with another embodiment of this invention.

FIG. 2 illustrates a turbo coder with rate conversion and/or rate matching in accordance with one form of this invention; the same references are used as in FIG. 1 to denote corresponding elements. The arrangement of FIG. 2 differs from that of FIG. 1 in that the optional switch 24 is not provided, and puncturing for rate conversion and/or rate matching is provided in a different manner by the RM control unit 22 in conjunction with an interleaver 28 to operate as described below. It is observed that the interleaver 28 provides an interleaving process that is the same as that of the interleaver 14, so that little extra complexity is added by the arrangement of FIG. 2.

The rate conversion operation of the arrangement of FIG. 2 is described below, for a fixed rate ½ coder, and is represented by the following Table 2 which can be compared with Table 1 above:

TABLE 2

| S    | s0 | s1 | s2 | s3 | s4 | s5 | s6 | s7 | s8 | s9 | s10 |
|------|----|----|----|----|----|----|----|----|----|----|-----|
| P1   | p0 | p1 | p2 | p3 | p4 | p5 | p6 | p7 | p8 | p9 | p10 |
| A    |    | a1 |    | a3 |    | a5 |    | a7 |    | a9 |     |
| I[A] | a9 | a7 |    |    |    |    |    | a5 | a1 |    | a3  |
| P2   | q0 | q1 | q2 | q3 | q4 | q5 | q6 | q7 | q8 | q9 | q10 |

In the operation of the arrangement of FIG. 2 as shown by Table 2, consecutive systematic bits S and parity bits P1 and P2 are again denoted s0–s10, p0–p10, and q0–q10 respectively. As in the case of Table 1, all of the systematic bits S are passed to the multiplexer 16, as are alternate ones of the parity bits P1, the bits p0, p2, p4, p6, p8, and p10 being punctured or deleted as indicated by strike-through lines in the P1 line in Table 2. A line A indicates addresses a1, a3, a5, a7, and a9 of the parity bits P1 that are not punctured, and which are supplied by the RM control unit 22 corresponding to the positions of the parity bits P2 that are punctured in the known arrangement as indicated in Table 1. These addresses are interleaved by the interleaver 28, in the same interleaving manner as provided by the interleaver 14, thereby producing interleaved addresses which by way of example are represented in line I[A] in Table 2. The parity bits P2 at corresponding times (or equivalently, address locations in a buffer, not shown, which is used in implementing the turbo coder) are punctured or deleted, these being the bits q0, q1, q6, q7, and q9 as shown by strike-through lines for these bits.

It can be seen from an examination of Table 2 in conjunction with the above description that this eliminates the parity loss puncturing referred to above. For example, it can be seen that the P2 parity bit q6 which is deleted corresponds in time to the interleaved systematic bit s5, for which the corresponding P1 parity bit p5 is not deleted.

For variable puncturing for rate matching, a similar principle is applied. This is described below for the case of a rate ⅓ turbo coder, for which the switches 18 and 20 do not perform any fixed rate puncturing, in association with the following Table 3:

TABLE 3

| S    | s0 | s1 | s2 | s3 | s4 | s5 | s6 | s7 | s8 | s9 | s10 |
|------|----|----|----|----|----|----|----|----|----|----|-----|
| P1   | p0 | p1 | p2 | p3 | p4 | p5 | p6 | p7 | p8 | p9 | p10 |
| A    |    | a1 |    |    |    |    | a6 |    |    |    |     |
| I[A] |    |    |    | a6 |    |    |    | a1 |    |    |     |
| P2   | q0 | q1 | q2 | q3 | q4 | q5 | q6 | q7 | q8 | q9 | q10 |

A known rate matching algorithm is used to determine the P1 parity bits that are to be punctured or deleted in a turbo code arrangement as shown in FIG. 2 to provide a desired rate matching, for example to up to 20% of the coded block size, it being understood that a similar number of P2 parity bits are also being deleted. In Table 3, these P1 parity bits are the bits p0 and p5 as shown by strike-through lines. The addresses of adjacent, unpunctured parity bits, a1 and a6 as shown in line A of Table 3, are used to determine, after interleaving by the interleaver 28 as shown by the interleaved addresses I[A] in Table 3, the corresponding P2 parity bits, in this case q3 and q7 as shown by strike-through lines in Table 3, which are punctured or deleted by the switch 20 in FIG. 2. Again, this provides the desired rate matching while avoiding the parity loss puncturing as described above. In comparison to this zero loss of both parity bits, the prior art provides a loss of both parity bits which generally increases with increasing puncturing rates.

It can be appreciated that the choice of adjacent, unpunctured bits as described above is relatively arbitrary, and any other unpunctured bits could be chosen instead in accordance with a desired method of choice. However, the distribution of puncturing of the P1 parity bits for variable puncturing can ensure that the adjacent P1 parity bits will be unpunctured, and this provides a convenient and easy determination of unpunctured bit positions simply by using a delay element or address incrementing.

The arrangement of FIG. 2 can also provide a combination of fixed rate and variable rate matching or puncturing. For example, this is represented in the following Table 4 for a combination of fixed puncturing for rate conversion to a rate ½ coder as described above with reference to Table 2, and up to 20% puncturing of parity bits for variable puncturing for rate matching as described above with reference to Table 3.

TABLE 4

| S | s0 | s1 | s2 | s3 | s4 | s5 | s6 | s7 | s8 | s9 | s10 |
|---|---|---|---|---|---|---|---|---|---|---|---|
| P1 | ~~p0~~ | p1 | ~~p2~~ | p3 | ~~p4~~ | p5 | ~~p6~~ | p7 | ~~p8~~ | p9 | ~~p10~~ |
| A |  | a1 |  | a3 |  | a5 |  | a7 |  | a9 |  |
| I [A] | a9 | a7 |  |  |  | a5 | a1 |  |  | a3 |  |
| V-A |  |  | a2 |  |  |  | a6 |  |  |  |  |
| V-I [A] |  |  |  | a6 |  |  |  |  | a2 |  |  |
| P2 | ~~q0~~ | ~~q1~~ | q2 | ~~q3~~ | q4 | q5 | ~~q6~~ | ~~q7~~ | ~~q8~~ | ~~q9~~ | q10 |

In Table 4, lines F-A and F-I[A] represent the addresses and interleaved addresses respectively for the fixed puncturing for rate conversion which are as in Table 2 above, and lines V-A and V-I[A] represent the addresses and interleaved addresses respectively for the variable puncturing for rate matching, following similar principles to those described above with reference to Table 3 with a second interleaving phase. The P2 parity bits which are punctured or deleted are again indicated by strike-through lines as determined by the respective interleaved addresses.

It is desirable also to be able to apply variable puncturing for rate matching to convolutionally coded (not turbo coded) data bits, again for example to up to 20% of the coded block size and for reasons such as those given above. In a currently proposed communications system, it has been suggested that such puncturing for rate matching be applied to the entire convolutional coder output bit stream and would be optimum. However, the present inventors have determined that this is not necessarily the case, and provide an embodiment of this invention, described below with reference to FIG. 3, which also has the advantage of being substantially compatible with the rate matching arrangements for turbo coding as described above.

Figure 3:
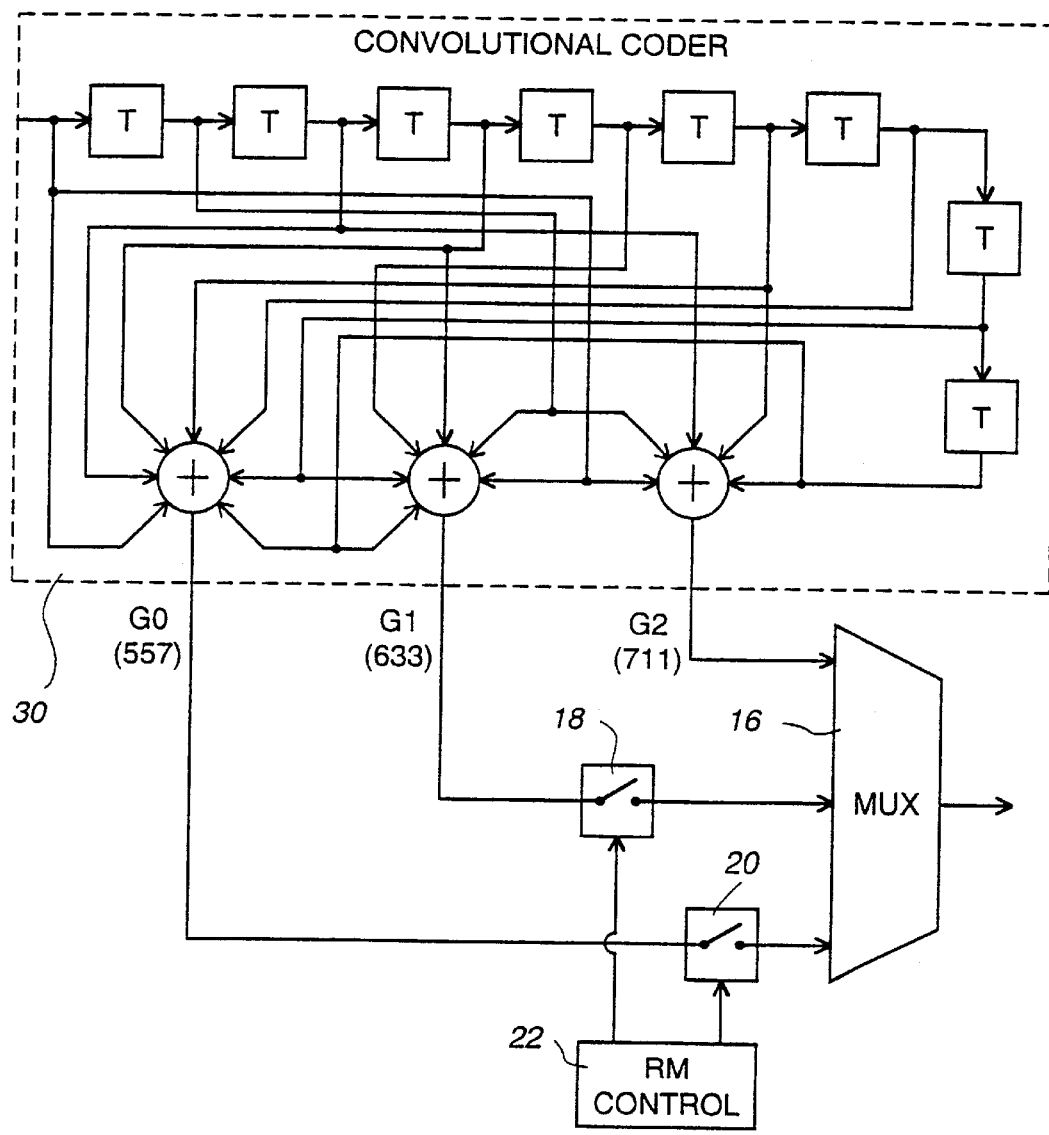

Referring to FIG. 3, a convolutional coder 30 with a constraint length K=9 is shown within a dashed line box and provides outputs G0, G1, and G2 in accordance with polynomials with octal numbers 557, 663, and 711 respectively. The convolutional coder 30 has a known form comprising a series of eight delay elements T and three modulo-2 adders (+) whose inputs are coupled to inputs and outputs of the delay elements in accordance with the respective polynomials, and whose outputs constitute the outputs of the coder 30. It can be appreciated that this is a rate 1/3 coder, providing 3 output bits for each input bit supplied to the first delay element T, and that it is a non-systematic coder, i.e. the individual input bits themselves are not supplied on any output of the coder.

According to the prior art, these three outputs would be multiplexed together, and variable puncturing for rate matching would be applied to the multiplexed output, in the manner of the multiplexer 16 and switch 24 in FIG. 1. In contrast to this, this embodiment of the invention applies variable puncturing for rate matching to only two selected ones of the three outputs of the coder, prior to multiplexing. As illustrated in FIG. 3 and explained below, the output G2 is not punctured. Consequently, as shown in FIG. 3, the coder arrangement also includes switches 18 and 20 for puncturing the coder outputs G1 and G0 respectively, a multiplexer 16 for multiplexing the punctured outputs G0 and G1 and the unpunctured output G2, and an RM control unit 22 for controlling the switches 18 and 20, in substantially the same arrangement as the corresponding elements in FIG. 2 (without the interleaver 30).

The selection of which of the 3 outputs of the coder 30 is not to be punctured is determined in dependence on the minimum free distance for respective combinations of the coder polynomials. The following Table 5 indicates this minimum free distance Dmin for the three different combinations of two of the three polynomials of the coder, and for all three polynomials:

TABLE 5

| Outputs | G0, G1 | G0, G2 | G1, G2 | G0, G1, G2 |
|---|---|---|---|---|
| Polynomials | 557, 663 | 557, 711 | 663, 711 | 557, 663, 711 |
| Dmin | 9 | 10 | 11 | 18 |

As can be appreciated from Table 5, in terms of the minimum free distance Dmin the polynomial 557 is weakest, and the polynomial 711 is the strongest. Accordingly, it can be appreciated, and it can be shown, that applying puncturing to the G0 and G1 coder outputs, and not to the G2 output, of the coder can achieve the best performance. It can be seen that this is the arrangement in FIG. 3.

While the above applies to a convolutional coder with a specific rate of 1/3 and specific polynomials, the same principals are applicable to convolutional coders with other rates and/or other polynomials, with puncturing for rate matching being applied to one or more of the coder outputs that correspond to the weakest polynomial(s) in terms of minimum free distance, and not being applied to one or more of the strongest polynomial(s) in terms of minimum free distance.

Although particular embodiments of the invention have been described in detail, it should be appreciated that numerous modifications, variations, and adaptations may be made without departing from the scope of the invention as defined in the claims.

What is claimed is:

1. A method of deleting parity bits produced by first and second convolutional coders of a coder arrangement to provide a desired rate of coded bits, data bits to be coded being supplied to the first coder and being supplied after an interleaving process to the second coder, comprising the steps of:

deleting parity bits from an output of the first coder;
   determining positions of parity bits that are not deleted from the output of the first coder;
   interleaving the determined positions in accordance with said interleaving process; and
   deleting parity bits from an output of the second coder at positions corresponding to the determined interleaved positions.

2. A method as claimed in claim 1 wherein approximately half of the parity bits are deleted from the output of each of the first and second coders.

3. A method as claimed in claim 2 and including the step of multiplexing together the data bits to be coded and the parity bits that are not deleted from the outputs of the first and second coders.

4. A method as claimed in claim 1 and including the step of multiplexing together the data bits to be coded and the parity bits that are not deleted from the outputs of the first and second coders.

5. A coder arrangement comprising:

a first convolutional coder responsive to data bits to be coded for producing first parity bits;
   an interleaver arranged to interleave in a predetermined manner the data bits to be coded to produce interleaved data bits;
   a second convolutional coder responsive to the interleaved data bits for producing second parity bits;

means for providing the data bits to be coded and some of the first and second parity bits as coded output data of the coder arrangement, others of the first and second parity bits being deleted;

a control unit for determining which of the first parity bits are deleted; and an interleaver responsive to the control unit for interleaving in said predetermined manner positions of the first parity bits that are not deleted to determine positions of the second parity bits which are deleted.

6. A coder arrangement as claimed in claim 5 wherein alternate ones of the first parity bits are deleted.

7. A coder arrangement as claimed in claim 6 wherein the first and second convolutional coders are substantially the same.

8. A coder arrangement as claimed in claim 5 wherein the first and second convolutional coders are substantially the same.

9. A method of rate matching by deleting coded data bits produced by a convolutional coder from data bits to be coded, the convolutional coder providing a plurality of outputs corresponding to respective coding polynomials, the polynomials providing respective coding strengths in terms of minimum free distance, the method comprising the steps of:

deleting coded data bits from at least one of the coder outputs corresponding to a relatively weak polynomial; and providing all of the coded data bits from at least another one of the coder outputs corresponding to a relatively strong polynomial with undeleted coded bits of the other coder outputs to provide coded data bits at a desired rate.

10. A method as claimed in claim 9 wherein the convolutional coder has three outputs and coded data bits are deleted from each of two of the outputs corresponding to the two weakest polynomials.

11. A method as claimed in claim 10 wherein the convolutional coder has a constraint length K=9 and coding polynomials represented by octal numbers 557, 633, and 711, coded data bits being deleted from the outputs corresponding to the polynomials 557 and 633 and not being deleted from the output corresponding to the polynomial 711.

12. A method of convolutional coding and rate matching data to provide coded data in response to data to be coded, comprising the steps of:

coding data to be coded in accordance with a rate ⅓ convolutional code of constraint length K=9 with polynomials represented by octal numbers 557, 633, and 711 to produce respective coded data bits; and supplying all of the coded data bits corresponding to the polynomial 711 and only some of the coded data bits corresponding to the polynomials 557 and 633 to provide said coded data at a desired rate less than three times the rate of the data to be coded.

13. A coder arrangement comprising:

a convolutional coder responsive to data bits to be coded to provide coded data bits at a plurality of outputs corresponding to respective coding polynomials, the polynomials providing respective coding strengths in terms of minimum free distance; and means for providing all of the coded data bits from at least one of the coder outputs corresponding to a relatively strong polynomial, and only some of the coded data bits from each other coder output corresponding to a relatively weaker polynomial, as coded data bits at a desired rate.

14. A coder arrangement as claimed in claim 13 wherein the convolutional coder has three outputs and said desired rate is less than three times a rate of the data bits to be coded.

15. A coder arrangement as claimed in claim 14 wherein the convolutional coder has a constraint length K=9 and coding polynomials represented by octal numbers 557, 633, and 711, wherein the coded data bits at the desired rate include all of the coded data bits from the coder output corresponding to the polynomial 711.

16. A convolutional coding and rate matching arrangement comprising:

a rate ⅓ convolutional coder of constraint length K=9 with polynomials represented by octal numbers 557, 633, and 711 for producing coded data bits at respective outputs in response to data bits to be coded supplied to an input of the convolutional coder; and means for providing all of the coded data bits from the convolutional coder output corresponding to the polynomial 711 and only some of the coded data bits from the convolutional coder outputs corresponding to the polynomials 557 and 633 to provide coded data at a desired rate less than three times the rate of the data to be coded.

17. A method of convolutional coding and rate matching data to provide coded data in response to data to be coded, comprising the steps of:

(a) coding data to be coded at a convolutional coder rate, wherein the convolutional coder rate is determined by the convolutional coder responsive to the data to be coded to provide the coded data at a plurality of outputs corresponding to respective coding polynomials, whereby the coding polynomials are characterized by respective coding strengths in terms of a minimum free distance;

(b) providing all of the coded data from at least one of the convolutional coder outputs corresponding to a relatively strong coding polynomial, at a desired coding rate; and (c) providing some of the coded data from each other convolutional coder output corresponding to a relatively weak coding polynomial, at the desired coding rate.

18. A convolutional coding and rate matching apparatus, comprising:

a means for coding data at a rate determined by a convolutional coder, wherein said convolutional coder is responsive to said data to be coded to provide a coded data at a plurality of outputs of said convolutional coder corresponding to respective coding polynomials, whereby said coding polynomials are characterized by respective coding strengths in terms of a minimum free distance;

a means for providing all of said coded data from at least one of said outputs of said convolutional coder corresponding to a relatively strong polynomial, at a desired coding rate; and a means for providing some of said coded data from each other of said outputs of said convolutional coder corresponding to a relatively weak polynomial, at said desired coding rate.

* * * * *